United States Patent
Yang

(10) Patent No.: US 6,864,821 B2
(45) Date of Patent: Mar. 8, 2005

(54) RESISTOR-CAPACITOR (R-C) HYBRID SUCCESSIVE APPROXIMATION REGISTER (SAR) ANALOG-TO-DIGITAL CONVERTER (ADC) WITH CENTER-SYMMETRIC DIFFERENTIAL RESISTOR STRING AND OTHER DIFFERENTIAL STRUCTURES

(75) Inventor: Steven Jyh-Ren Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/437,492

(22) Filed: May 14, 2003

(65) Prior Publication Data

US 2004/0227654 A1 Nov. 18, 2004

(51) Int. Cl.[7] .................................. H03M 1/12
(52) U.S. Cl. ........................ 341/155; 341/156
(58) Field of Search ......................... 341/154, 155, 341/156, 158, 159, 110–120

(56) References Cited

U.S. PATENT DOCUMENTS

| | | | | |
|---|---|---|---|---|
| 5,610,604 A | * | 3/1997 | Leacock et al. | 341/138 |
| 5,661,481 A | * | 8/1997 | Muramatsu | 341/120 |
| 5,703,588 A | * | 12/1997 | Rivoir et al. | 341/159 |
| 6,255,979 B1 | * | 7/2001 | Allee et al. | 341/159 |
| 6,437,722 B1 | * | 8/2002 | Yoshizawa | 341/154 |
| 6,459,400 B1 | * | 10/2002 | Steinbach | 341/156 |
| 6,570,523 B1 | * | 5/2003 | Bacrania et al. | 341/155 |
| 6,590,518 B1 | * | 7/2003 | Taft | 341/156 |

* cited by examiner

Primary Examiner—Michael Tokar
Assistant Examiner—Linh V Nguyen
(74) Attorney, Agent, or Firm—Stout, Uxa, Buyan & Mullins, LLP

(57) ABSTRACT

An analog-to-digital converter (ADC) includes a resistor network for generating multiple reference voltages. The resistor network includes multiple resistors connected in series to form a resistor string. A first portion of the resistors between either one of two end nodes and a central node of the string have substantially equal electrical resistances. A second portion of the resistors are refinements of at least part of the first portion resistors and are arranged further from the central node than the resistors of the first portion. Resistances of the second portion resistors are greater than resistances of the first portion resistors. When an electrical potential is applied between the two end nodes, the multiple reference voltages are produced between adjacent resistors. An ADC is also described including first and second capacitor arrays and a comparator. An apparatus and method are disclosed for generating a binary value corresponding to an analog input voltage.

3 Claims, 4 Drawing Sheets

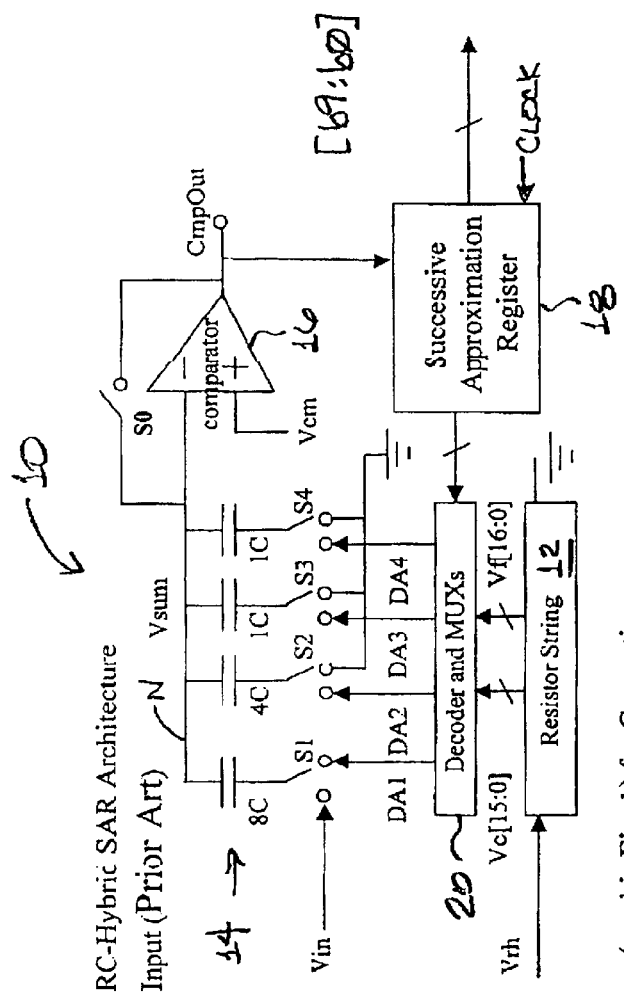
Fig. 1 Conventional RC-Hybrid SAR Architecture with Single-Ended Input (Prior Art)
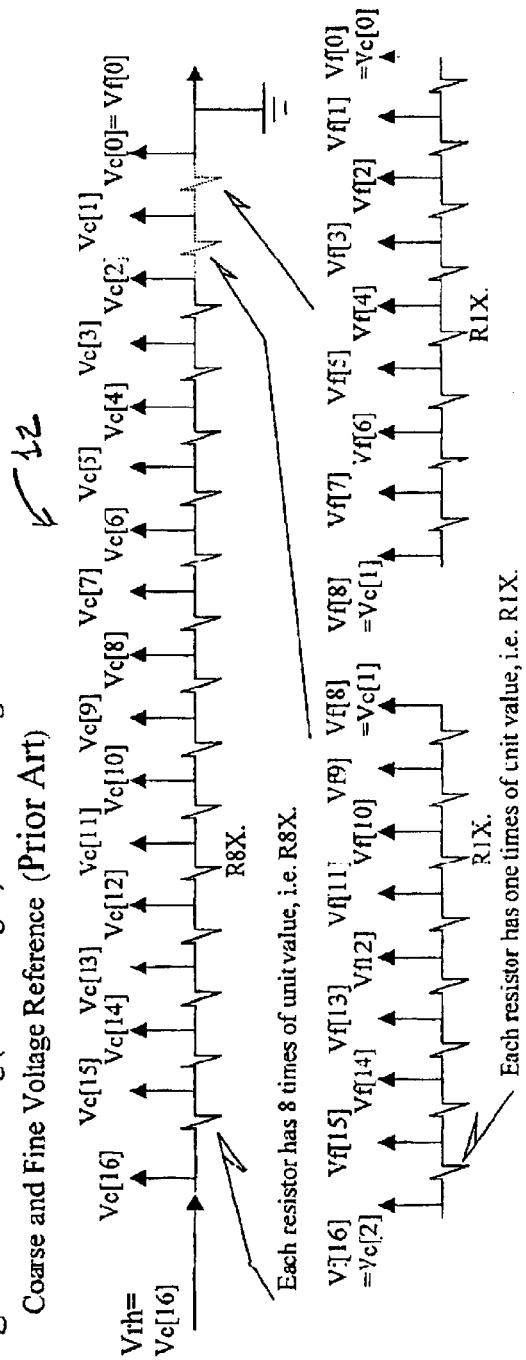
Fig. 2 Resistor String (used in Fig. 1) for Generating Coarse and Fine Voltage Reference (Prior Art)

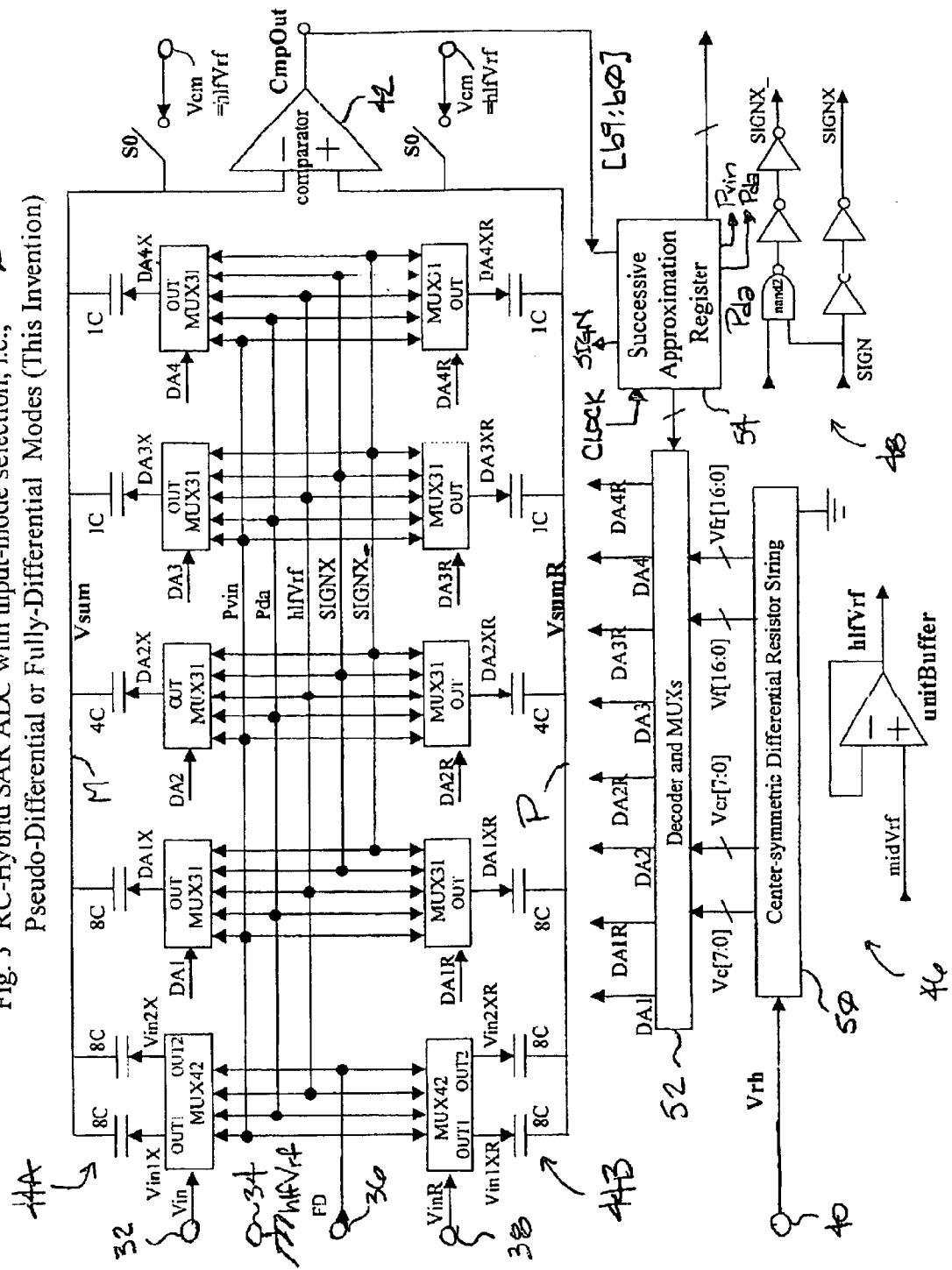
Fig. 3 RC-Hybrid SAR ADC with input-mode selection, i.e., Pseudo-Differential or Fully-Differential Modes (This Invention)

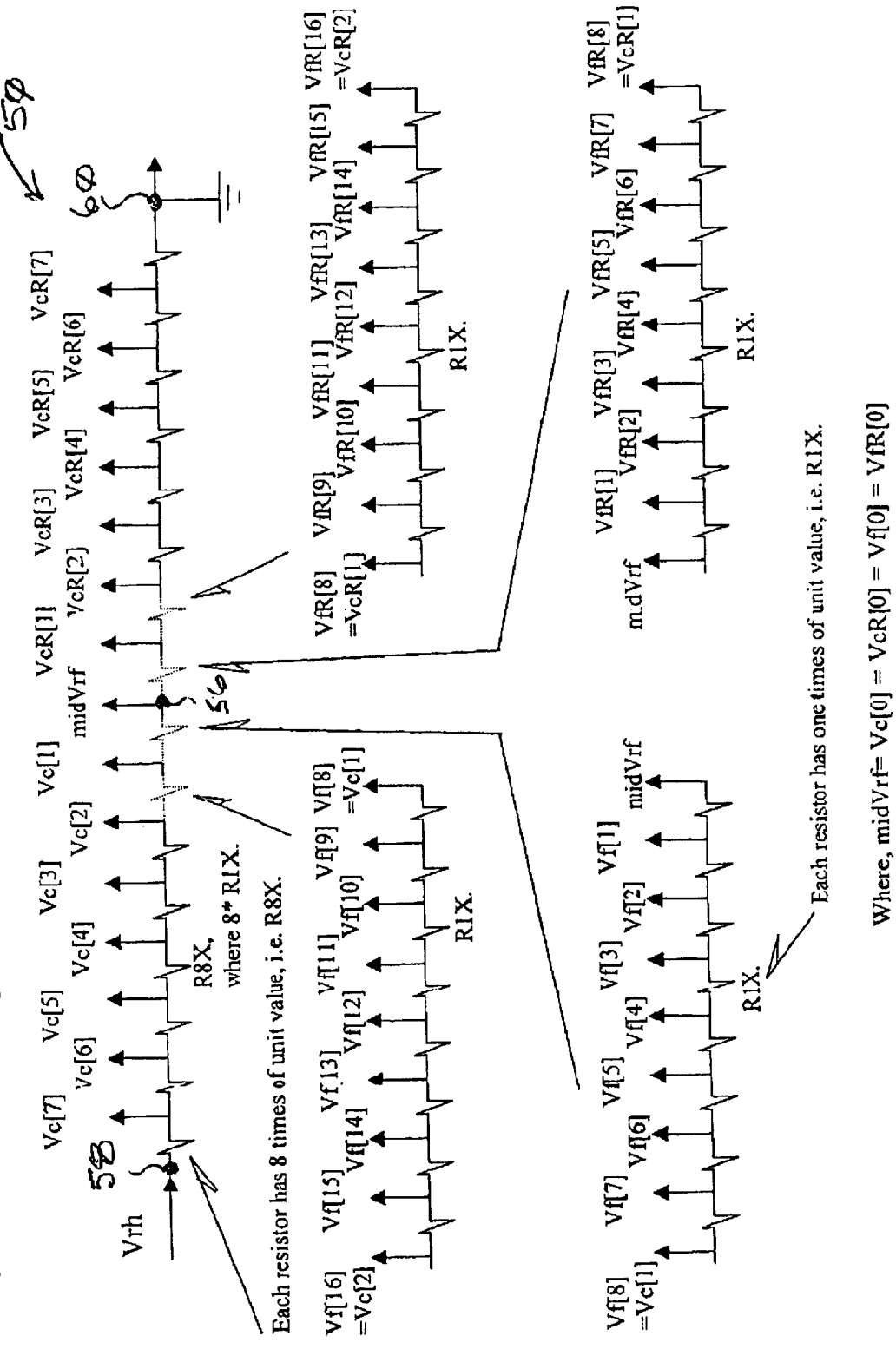
Fig. 4 Center-symmetric Differential Resistor String for Generating Coarse and Fine Voltage References, Vc[7:0], VcR[7:0], Vf[16:0], VfR[16:0], midVrf

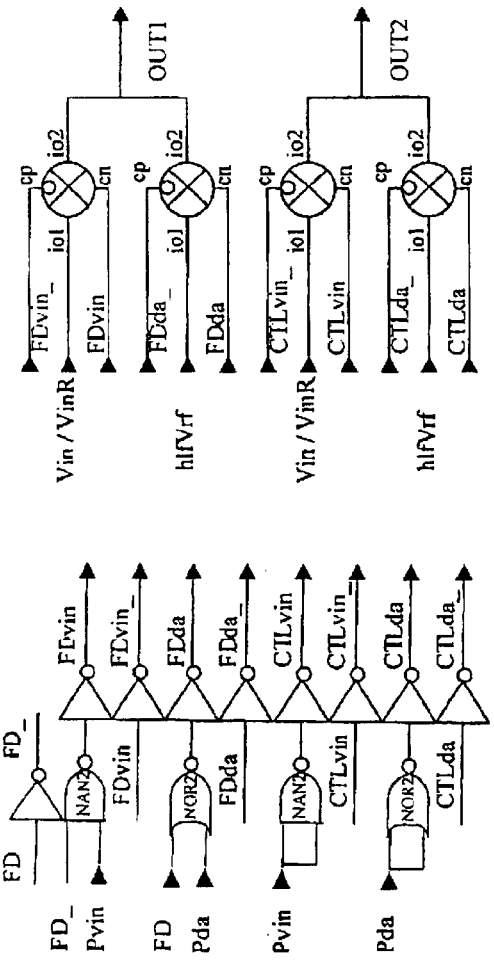
Fig 5(A) MUX42: Two of Four Multiplexer (This Invention)
(If FD=High, i.e. Fully-Differential Mode enabled, then FDvin= Low, Fdda= High), OUT1= hlfVrf
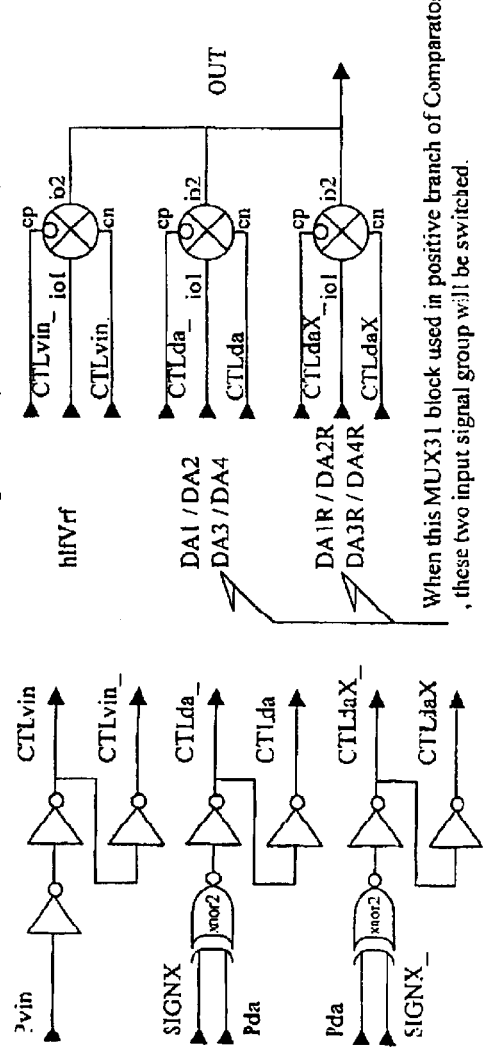
Fig. 5(B) MUX31: One of Three Multiplexer (This Invention)

RESISTOR-CAPACITOR (R-C) HYBRID SUCCESSIVE APPROXIMATION REGISTER (SAR) ANALOG-TO-DIGITAL CONVERTER (ADC) WITH CENTER-SYMMETRIC DIFFERENTIAL RESISTOR STRING AND OTHER DIFFERENTIAL STRUCTURES

BACKGROUND OF THE INVENTION

1. Field of the Invention

The present invention relates generally to analog-to-digital converter (ADC) circuits and, more particularly, to successive approximation register (SAR) ADC circuits.

2. Description of Related Art

Successive approximation register (SAR) analog-to-digital converters (ADCs) are popular due to their reasonably fast conversion time, yet moderate circuit complexity. Types of SAR ADCs include resistor string SAR ADCs, capacitor array SAR ADCs, and resistor-capacitor (R-C) hybrid SAR ADCs. R-C hybrid SAR ADCs are often used to reduce non-linearities due to lengthy resistor strings or bulky capacitor arrays in physical layouts.

FIG. 1 is a diagram of one embodiment of a known 10-bit resistor-capacitor (R-C) hybrid SAR ADC 10. The R-C hybrid SAR ADC 10 receives a single-ended analog input voltage "Vin," and includes a resistor string 12 for generating internal reference voltages. As indicated in FIG. 1, the reference voltages include 16 coarse reference voltages "Vc[15:0]" and 17 fine reference voltages "Vf[16:0]."

Operation of the R-C hybrid SAR ADC 10 may be described as including two phases: an initial sampling phase and a bit cycling phase. During the initial sampling phase, a switch S0 is closed, coupling an output terminal of a comparator 16 to a negative (−) input terminal of the comparator 16 and to a node "N," wherein a voltage "Vsum" exists between the node N and a ground reference potential (i.e., ground). A switch S1 is set to couple the analog input voltage Vin to one terminal of a largest of 4 binary-weighted capacitors of a capacitor array 14. Switches S2, S3, and S4 are set to couple terminals of the other 3 capacitors to ground.

Opposite terminals of all 4 capacitors of the capacitor array 14 are coupled to the node N. A positive (+) input terminal of the comparator 16 is connected to a reference voltage "Vcm." It is noted that Vcm=Vrh/2=Vc[8]. (See FIG. 2.)

The comparator 16 drives the node N until the voltage Vsum at the node N is equal to Vcm. The switch S0 is then opened, completing the initial sampling phase. Ideally, at the end of the initial sampling phase, an initial charge Q0, corresponding to the analog input voltage Vin, exists on the node N, wherein Q0=(Vcm−Vin)·8C+Vcm (4C+1C+1C).

During the bit cycling phase, a successive approximation register (SAR) block 18 of the R-C hybrid SAR ADC 10 produces a 10-bit output signal [b9:b0] during 10 consecutive cycles of a "CLOCK" signal. In the embodiment of FIG. 1, the bit decisions made during the bit cycling phase are based on a bit grouping {4, 4, 1, 1}. That is, bits in a first 4-bit group [b9:b6] are determined first during the first 4 cycles of the CLOCK signal. Bits in a second 4-bit group [b5:b2] are then determined during the next 4 cycles of the CLOCK signal, followed by a third 1-bit group [b1] during the ninth cycle of the CLOCK signal, and finally a fourth 1-bit group [b0] during the tenth cycle of the CLOCK signal.

During the bit cycling phase, the switch S1 is set to couple the corresponding terminal of the largest of the 4 binary-weighted capacitors of the capacitor array 14 to a signal line DA1, and the switches S2, S3, and S4 are set to couple the corresponding terminals of the other 3 capacitors to respective signal lines DA2, DA3, and DA4.

FIG. 2 is a diagram of a known embodiment of the resistor string 12 of FIG. 1. As indicated in FIG. 2, the resistor string 12 produces the 16 coarse reference voltages Vc[15:0] and the 17 fine reference voltages Vf[16:0].

Referring back to FIG. 1, during the determination of the bits of the first 4-bit group [b9:b6], a decoder and multiplexers (MUXs) component 20 of the R-C hybrid SAR ADC 10 selectively couples the signal line DA1 to one of the 16 coarse reference voltages Vc[15:0], starting with Vc[8]. The resulting binary search algorithm typically requires 4 cycles of the CLOCK signal to determine the values of the bits of the first 4-bit group [b9:b6]. While the decoder and MUXs component 20 selectively couples the signal line DA1 to one of the 16 coarse reference voltages Vc[15:0], the decoder and MUXs component 20 couples the signal lines DA2, DA3 and DA4 to ground. The voltage Vsum at node N is given by: Vsum=Vcm−Vin·(8C/Ct)+DA1·(8C/Ct)+DA2·(4C/Ct)+DA3·(C/Ct)+DA4·(C/Ct), where Ct=8C+4C+1C+1C=14C. The comparator output signal "CmpOut" is allowed to settle, then latched into the SAR block 18. The SAR block 18 uses the latched value of the CmpOut signal in a binary search algorithm for selecting a reference voltage used during the next step.

Four cycles of the CLOCK signal are required to select a final reference voltage Vc[x] for coupling to the DA1 signal line, where 0≦x≦15. When DA1=Vc[x], the CmpOut signal is asserted (e.g., a logic '1'), and when DA1=Vc[x+1], the CmpOut signal is deasserted (e.g., a logic '0'). Since each of the 16 reference voltages Vc[15:0] correspond to a 4-bit binary code, the selection of the final reference voltage Vc[x] for the DA1 signal line corresponds to the determination of the bits of the first 4-bit group [b9:b6].

After the bits of the first 4-bit group [b9:b6] are determined, the bits of the second 4-bit group [b5:b2] are determined in a similar fashion. Values of the CmpOut output signal produced by the comparator 16 are used to selectively couple one of 16 fine reference voltages Vf[15:0] to the DA2 signal line. After the CmpOut output signal of the comparator 16 settles, the CmpOut signal is latched into the SAR BLOCK 18, and used to select the next reference voltage. After another 4 cycles of the CLOCK signal, the bits of the second 4-bit group [b5:b2] are determined.

After the bits of the second 4-bit group [b5:b2] are determined, the bit of the third 1-bit group [b1] is determined. During the ninth cycle of the CLOCK signal, a reference voltage selected from the set {Vf[2], Vf[0]} is coupled to the DA3 signal line. After the bit of the third 1-bit group [b1] is determined, the bit of the fourth 1-bit group [b0] is determined. During the tenth cycle of the CLOCK signal, a reference voltage selected from the set {Vf[1], Vf[0]} is coupled to the DA4 signal line. At the end of bit cycling phase, the SAR BLOCK 18 of the R-C hybrid SAR ADC 10 produces the 10-bit output signal [b9:b0].

Single-ended (unbalanced) signals are referenced to a voltage level commonly called a "signal ground." While the signal ground is typically a negative power supply voltage level, the signal ground may also be a positive voltage supply level or an external reference voltage level. Single-ended signals are typically conveyed via a pair of conductors. A first of the two conductors carries the signal, and the second conductor functions as voltage reference level and/or a current return path. The second conductor is typically connected to the signal ground.

Differential signals are also propagated via a pair of conductors. In this case, however, the conductors carry equal and opposite signals, and the differential signal is a voltage between the conductors. As each signal is equal and opposite, no separate current return path is required. Conductors used to convey a differential signal typically have a constant distance between them, are typically routed together from a source to a destination, and each conductor typically has the same electrical impedance.

Due to their electrical impedances, noise voltages are commonly induced in conductors carrying voltage signals. Examples of noise sources include radiated electromagnetic interference (EMI) and signals on nearby signal lines. "Common-mode noise" is defined as the component of noise voltage that appears equally and in phase on conductors relative to a common reference.

As electrical impedances of conductors carrying single-ended signals are not equal, noise voltages induced in the conductors are not equal. With a single-ended signal, the received voltage includes the signal voltage and a noise voltage component equal to a difference between the (unequal) noise voltages.

Electrical impedances of conductors carrying differential signals, on the other hand, are typically equal as described above. As a result, noise voltages induced in the conductors are substantially equal. With a differential signal, the received voltage includes the signal voltage and a noise voltage component equal to a difference between the (substantially equal) noise voltages. Noise voltage components with differential signals are typically much smaller than those with single-ended signals.

A difference between a maximum level and a minimum level of a signal defines a "dynamic range" of the signal. As voltages on conductors carrying a differential signal are equal and opposite, given a fixed power supply voltage range, the dynamic range of the differential signal may be as much as twice that of a single-ended signal.

Due to the greater dynamic range and the tendency for noise voltages induced in conductors to be equal (and therefore substantially canceling), signal-to-noise ratios with dynamic signals are often much greater than those with single-ended signals.

It is noted the R-C hybrid SAR ADC 10 of FIG. 1 cannot provide the benefits of differential signaling (e.g., common-mode noise cancellation, greater dynamic range, and greater signal-to-noise ratio) due to the many single-ended structures therein (e.g., the resistor string 12 and the capacitor array 14). At the same time, differential amplifiers and cables are often more complex and more expensive to produce than single-ended amplifiers and cables, and differential input signals are often not available. A need thus exists for an analog-to-digital converter (ADC) that can receive either a single-ended analog input voltage or a differential analog input voltage, and uses differential signaling techniques to produce an output signal having a lower noise level than is typical of current ADCs.

SUMMARY OF THE INVENTION

An analog-to-digital converter (ADC) is disclosed including a resistor network for generating multiple reference voltages. The resistor network includes multiple resistors connected in series to form a resistor string having a central node and two end nodes. The resistors of a first string or portion of the resistor string are arranged between either one of the two end nodes and the central node, and the resistors of a second string or portion of the resistor string are arranged further from the central node than the resistors of the first portion. The resistors of the first portion can have substantially equal resistances and can be refinements of a part of the resistors of the second portion.

An ADC is also described including first and second capacitor arrays and a comparator. The first and second capacitor arrays each include multiple capacitors. One of 2 terminals of each of the capacitors of the first capacitor array is coupled to a first node, and one of 2 terminals of each of the capacitors of the second capacitor array is coupled to a second node. The comparator is coupled to the first and second nodes and configured to produce a binary output signal dependent upon a voltage difference between the first and the second nodes.

A method is disclosed for generating a binary value corresponding to an analog input voltage. The method includes providing a pair of nodes and a comparator coupled to the pair of nodes, wherein the comparator is configured to produce a binary output signal dependent upon a voltage difference between the pair of nodes. A voltage indicative of an analog input voltage is established between the pair of nodes, and the binary output signal of the comparator is latched as a most significant bit (MSB) of the binary value. An ADC implementing the method is also described.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE FIGURES

FIG. 1 is a diagram of one embodiment of a known resistor-capacitor (R-C) hybrid successive approximation register (SAR) analog-to-digital converter (ADC), wherein the known R-C hybrid SAR ADC includes a resistor string;

FIG. 2 is a diagram of a known embodiment of the resistor string of FIG. 1;

FIG. 3 is a diagram of one embodiment of a R-C hybrid SAR ADC including a center-symmetric differential resistor string and multiple multiplexer components;

FIG. 4 is a diagram of one embodiment of the center-symmetric differential resistor string of FIG. 3;

FIG. 5A is a diagram of one embodiment of a representative one of a type of the multiple multiplexer components of FIG. 3; and FIG. 5B is a diagram of one embodiment of a representative one of another type of the multiple multiplexer components of FIG. 3.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale.

In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims.

FIG. 3 is a diagram of one embodiment of a resistor-capacitor (R-C) hybrid successive approximation register (SAR) analog-to-digital converter (ADC) 30 configurable to operate in either a pseudo-differential mode or a fully-differential mode. The R-C hybrid SAR ADC 30 may be, for example, formed on a surface of a semiconductor substrate of an integrated circuit.

The R-C hybrid SAR ADC 30 has a fully differential SAR ADC core, is adapted to receive either a single-ended analog input voltage signal or a differential analog input voltage signal, and is configurable to convert the analog input voltage signal to a corresponding binary value including a number of ordered binary digits (i.e., "bits"). Herein below, the analog input voltage signal will be referred to as "AVin." In the embodiment of FIG. 3, the R-C hybrid SAR ADC 30 includes 5 terminals: a first analog input voltage terminal 32 for receiving a first analog input voltage "Vin," an analog reference ground potential (i.e., analog ground) terminal 34, an input terminal 36 for receiving a fully differential (FD) control signal, a second analog input voltage terminal 38 for (optionally) receiving a second analog input voltage "VinR," and an input terminal 40 for receiving a reference voltage "Vrh." "UnitBuffer" circuitry 46 of the R-C hybrid SAR ADC 30 receives a "midVrf" voltage level, where midVrf=Vrh/2, and produces an output signal hlfVrf, where hlfVrf midVrf=Vrh/2. The unitBuffer circuitry 46 unit gain buffers the midVrf voltage level to overcome loading effects. The hlfVrf voltage level produced by the unitBuffer circuitry 46 is distributed throughout the R-C hybrid SAR ADC 30, and represents the analog reference ground potential (i.e., the analog ground). As indicated in FIG. 3, the analog ground terminal 34 is connected to the hlfVrf voltage level produced by the unitBuffer circuitry 46.

One of two wires used to transmit a single-ended analog signal to the R-C hybrid SAR ADC 30 is expectedly a signal wire, and the other wire expectedly provides a reference potential and/or a current return path. The signal wire is expectedly connected to the first analog input voltage terminal 32, and the other wire is expectedly connected to the analog ground terminal 34. In this situation, the second analog input voltage terminal 38 is also expectedly connected to the analog ground terminal 34, and the analog input voltage signal AVin is equal to Vin.

Both of two wires used to transmit a differential analog signal to the R-C hybrid SAR ADC 30 are expectedly signal wires. One of the signal wires is expectedly connected to the first analog input voltage terminal 32, and the other signal wire is expectedly connected to the second analog input voltage terminal 38. A shield conductor surrounding the two wires may be connected to the analog ground terminal 34. In this situation, the analog input voltage signal AVin is equal to (Vin−VinR). A direct current level of the analog input voltage signal AVin is expectedly driven to the hlfVrf analog ground voltage level by external circuitry.

The FD control signal received at the input terminal 36 determines whether the R-C hybrid SAR ADC-30 operates in the pseudo-differential mode or the fully-differential mode. For example, in the embodiment of FIG. 3, when the FD control signal is a logic '0', the R-C hybrid SAR ADC 30 operates in the pseudo-differential mode, and when the FD control signal is a logic '1', the R-C hybrid SAR ADC 30 operates in the fully-differential mode. When the analog input voltage signal is a single-ended signal, the R-C hybrid SAR ADC 30 is intended to operate in the pseudo-differential mode. When the analog input voltage signal is a differential signal, the R-C hybrid SAR ADC 30 is intended to operate in the fully-differential mode. In the pseudo-differential mode, the R-C hybrid SAR ADC 30 obtain benefits similar to those obtained in the fully-differential mode (e.g., reduction in common-mode noise, increase dynamic range, etc.).

In the embodiment of FIG. 3, the R-C hybrid SAR ADC 30 also includes a comparator 42. The comparator 42 receives two analog input signals at positive (+) and negative (−) input terminals, and produces an output signal at an output terminal. The output signal has a voltage that falls within either a first voltage range associated with a "high" logic level (i.e., a logic '1' voltage range), or a second voltage range associated with a "low" logic level (i.e., a logic '0' voltage range), dependent on which of the two analog input signals has a greater voltage.

The comparator 42 may be characterized as having an input offset voltage affecting the output signal. In this situation, the comparator 42 and/or the fully differential circuitry described below preferably provides input offset voltage cancellation capability for the comparator 42.

In the embodiment of FIG. 3, the R-C hybrid SAR ADC 30 also includes a center-symmetric differential resistor string 50 for generating reference voltages, a pair of multiplexers (MUXs) labeled "MUX42," and 4 pairs of multiplexers labeled "MUX31." In general, during operation of the R-C hybrid SAR ADC 30, the MUX42 and MUX31 components collectively select from among the reference voltages and connect (i.e., "direct") the selected reference voltages to terminals of capacitors of a first capacitor array 44A and a second capacitor array 44B. The MUX42 and MUX31 components receive input analog reference voltage signals and digital control signals. As indicated in FIG. 3 a successive approximation register (SAR) block 54 produces digital control signals "Pvin" and "Pda" received by the MUX42 and MUX31 components.

One of the MUX42 components connects selected reference voltages to terminals of 2 capacitors of the capacitor array 44A, and produces 2 output signals at "OUT1" and "OUT2" output terminals. The signal produced at the OUT1 terminal has a voltage "Vin1X," and the signal produced at the OUT2 terminal has a voltage "Vin2X." This MUX42 component receives the 2 control signals Pvin and Pda, where only one of the two control signals is asserted (e.g., a logic '1') at any given time. For this MUX42 component, when the Pvin control signal is asserted (e.g., a logic '1') and the FD control signal is deasserted (e.g., a logic '0'), both Vin1X and Vin2X are equal to a voltage "VinR" received by the other MUX42 component. On the other hand, when the Pda control signal is asserted (e.g., a logic '1') and the FD control signal is deasserted (e.g., a logic '0'), both Vin1X and Vin2X will be equal to the voltage signal hlfVrf produced by the unitBuffer circuitry 46 and received by the MUX42 component.

For example, the Pvin control signal may be initialized as asserted, and the Pda signal may be initialized as deasserted. When the Pvin signal is deasserted, the Pda signal may be asserted after a small delay time (e.g., 5 nanoseconds).

The other MUX42 component connects selected reference voltages to terminals of 2 capacitors of the capacitor array 44B, and produces 2 output signals at the OUT1 and OUT2 terminals. The signal produced at the OUT1 terminal has a voltage "Vin1XR," and the signal produced at the OUT2 terminal has a voltage "Vin2XR." This MUX42 component also receives the 2 control signals Pvin and Pda. For this MUX42 component, when the Pvin control signal is asserted (e.g., a logic '1') and the FD control signal is deasserted (e.g., a logic '0'), both Vin1XR and Vin2XR are equal to a voltage "Vin" received by the other MUX42 component. On the other hand, when the Pda control signal is asserted (e.g., a logic '1') and the FD control signal is deasserted (e.g., a logic '0'), both Vin1XR and Vin2XR will be equal to the voltage signal hlfVrf received by the MUJX42 component.

During operation of the R-C hybrid SAR ADC 30, the MUX31 components collectively select 4 pairs of the reference voltages, and connect (i.e., direct) them to terminals of 4 pairs of capacitors of the capacitor arrays 44A and 44B. Each MUX31 component of a representative pair of the MUX31 components receives the Pvin and Pda control signals. One of the MUX31 components of the representative pair connects selected reference voltages to a terminal of a capacitor of the capacitor array 44A. This MUX31 component receives a "DAn" signal and produces an output signal "DAnX" at an "OUT" output terminal, where $1 \leq n \leq 4$. When the Pvin control signal is asserted (e.g., a logic '1'), the DAnX output signal is equal to the voltage hlfVrf also received by the MUX31 component.

A logic section 48 receives the Pda control signal and a "SIGN" control signal, and generates control signals "SIGNX" and "SIGNX_" dependent on the Pda and SIGN control signals. Each MUX31 component of the representative pair of the MUX31 components also receives the control signals SIGNX and SIGNX_. When the Pda control signal is asserted (e.g., a logic '1'), the DAnX output signal of the MUX31 component that connects selected reference voltages to the terminal of the capacitor of the capacitor array 44A is either the DAn signal or a "DAnR" signal received by the other MUX31 component of the representative pair dependent upon the SIGN signal.

The other MUX31 component of the representative pair connects selected reference voltages to a terminal of a capacitor of the capacitor array 44B. This MUX31 component receives the DAnR signal as described above, and produces an output signal "DAnXR" at an "OUT" output terminal, where $1 \leq n \leq 4$. When the Pvin control signal is asserted (e.g., a logic '1'), the DAnXR output signal is equal to the voltage hlfVrf also received by the MUX31 component. When the Pda control signal is asserted (e.g., a logic '1'), the DAnXR output signal is either the DAnR signal or the DAn signal received by the other MUX31 component of the representative pair dependent upon the SIGN signal.

The center-symmetric differential resistor string 50 generates 8 differential coarse reference voltage pairs Vc[7:0] and Vcr[7:0] and 17 differential fine reference voltage pairs Vf[16:0] and Vfr[16:0]. Each differential voltage reference pair has a center-symmetric property: midVrf=(Vc[m]+Vcr[m])/2 and midVrf=(Vf[n]+Vfr[n])/2, where $0 \leq m \leq 7$ and $0 \leq n \leq 16$, and midVrf is substantially equal to Vrh/2.

FIG. 4 is a diagram of one embodiment of the center-symmetric differential resistor string 50 of FIG. 3. In the embodiment of FIG. 4, the center-symmetric differential resistor string 50 includes several resistor elements (e.g., "resistors") connected in series. The resulting center-symmetric differential resistor string 50 has a central node 56 and two end nodes labeled 58 and 60 in FIG. 4. Equal numbers of resistors are connected between the central node 56 and each of the two end nodes 58 and 60. In the embodiment of FIG. 4, the received reference voltage Vrh is applied between the two end nodes 58 and 60 of the center-symmetric differential resistor string 50, and the reference voltages are produced between adjacent resistors of the center-symmetric differential resistor string 50.

As indicated in FIG. 4, the center-symmetric differential resistor string 50 generates the midVrf voltage level (midVrf=Vrh/2) at the central node 56. As described above, the midVrf voltage level is received by the unitBuffer circuitry 46 and produced by the unitBuffer circuitry 46 as the output voltage signal hlfVrf, where hlfVrf=midVrf=Vrh/2.

In the embodiment of FIG. 4, a first string or portion of the resistors of the center-symmetric differential resistor string 50 have values equal to a unit value, and a second string or portion of the resistors have values 8 times the unit value. Resistors of the first portion can be said to be refinements of a pan of the resistors of the second portion. More particularly, as shown in FIG. 4, the resistors of the first portion are arranged in groups of eight, and, thus, each group of eight can be considered to be a refinement of a resistor of the second portion in that the total resistance is the same. It is noted that the center-symmetric differential resistor string 50 may be implemented using only unit-valued resistors, wherein the resistors having values 8 times the unit value may be formed by connecting 8 unit-valued resistors in series.

Referring back to FIG. 3, the R-C hybrid SAR ADC 30 also includes a decoder and multiplexers (MUXs) component labeled 52 and the successive approximation register (SAR) block 54. During operation of the R-C hybrid SAR ADC 30, the decoder and MUXs component 52 selects 4 of the differential reference voltage pairs produced by the center-symmetric differential resistor string 50 dependent on control signals from the SAR block 54, and produces the 4 differential reference voltages pairs as the DAn and DAnR signals described above, where $1 \leq n \leq 4$. As described above and indicated in FIG. 3, the 4 pairs of MUX31 components receiving the DAn and DAnR signals selectively provide the 4 differential reference voltages pairs to terminals of 4 capacitors of the capacitor array 44A, and to 4 corresponding capacitors of the capacitor array 44B.

For example, the decoder and MUXs component 52 may select a differential reference voltage pair from the set $\{Vc[m], VcR[m]\}$, where $0 \leq m \leq 7$, and produce the differential reference voltage pair as the DA1 and DA1R signals. Similarly, the decoder and MUXs component 52 may select a differential reference voltage pair from the set $\{Vf[n], VfR[n]\}$, where $0 \leq n \leq 16$, and produce the differential reference voltage pair as the DA2 and DA2R signals. The decoder and MUXs component 52 may select a differential reference voltage pair from the set $\{Vf[n], VfR[n]\}$, where n=$\{0, 2\}$, and produce the differential reference voltage pair as the DA3 and DA3R signals. The decoder and MUXs component 52 may select a differential reference voltage pair from the set $\{Vf[n], VfR[n]\}$, where n=$\{0,1\}$, and produce the differential reference voltage pair as the DA4 and DA4R signals.

It is noted that a MUXs portion of the decoder and MUXs component 52 receives analog input signals from the center-symmetric differential resistor string 50 and digital control inputs from a decoder portion of the of the decoder and MUXs component 52. The decoder portion includes digital logic circuitry and receives the control signals from the SAR block 54.

In general, the SAR block 54 implements a binary search algorithm in order to produce a 10-bit output signal b[9:0] corresponding to the analog input voltage signal, where the analog input signal may be a single-ended analog input voltage signal or a differential analog input voltage signal. The bits of the output signal b[9:0] are ordered from a most significant bit (MSB) b[9] to a least significant bit (LSB) b[0], and convey a binary value.

The SAR block 54 implements the initial sampling phase and the cycling bit phase described above. During a first portion of the cycling bit phase, and during a single cycle of a received "CLOCK" signal, the most significant bit b[9] of the 10-bit output signal b[9:0] is determined. The value of bit b[9] is also distributed within the R-C hybrid SAR ADC 30 as the SIGN control signal described above. When the analog input voltage signal AVin≧Vrh/2, the SIGN control signal is asserted (e.g., a logic '1'). During the subsequent conversion process, all of the DAnX signals are greater than Vrh/2, and all of the DAnXR signals are less than Vrh/2, where 1≦n≦4. On the other hand, when AVin<Vrh/2, the SIGN control signal is deasserted (e.g., a logic '0'), and during the subsequent conversion process all of the DAnX signals are less than Vrh/2, and all of the DAnXR signals are greater than Vrh/2, where 1≦n≦4.

Following the determination of the most significant bit b[9] of the 10-bit output signal b[9:0], the SAR block 54 may implement a binary search algorithm much as described above to determine the remaining 9 bits b[8:0]. That is, the remaining 9 bits b[8:0] may be divided into bit groupings, and decisions made during the bit cycling phase may be based on the bit groupings, wherein bits in each x-bit grouping are determined during x cycles of the CLOCK signal, 1≦x≦9. In any case, the 10-bit output signal b[9:0] is expectedly produced after 10 cycles of the CLOCK signal.

During the initial sampling phase, two separate switches each labeled "S0" in FIG. 3 are closed such that a voltage "Vsum" at a node "M" and a voltage "VsumR" at a node "P" are driven to a common mode voltage "Vcm", where Vcm=hlfVrf. As a result, one terminal of each of the capacitors of the capacitor arrays 44A and 44B is also driven to the common mode voltage Vcm. At the same time, the control signal Pvin is asserted (e.g., a logic '1') and the Pda signal is deasserted (e.g., a logic '0'). The output signals of the MUX42 and MUX31 components connected to terminals of the capacitors of the capacitor array 44A, from left to right in FIG. 4, form a set {Vin1X, Vin2X, DA1X, DA2X, DA3X, DA4X}, and are connected to corresponding voltages of the voltage set {Vin, Vin, hlfVrf, hlfVrf, hlfVrf, hlfVrf}. That is, Vin1X=Vin, Vin2X=Vin, ..., and DA4X=hlfVrf.

Similarly, the output signals of the MUX42 and MUX31 components connected to terminals of the capacitors of the capacitor array 44B, from left to right in FIG. 4, form a set {Vin1XR, Vin2XR, DA1XR, DA2XR, DA3XR, DA4XR}, and are connected to corresponding voltages of the voltage set {VinR, VinR, hlfVrf, hlfVrf, hlfVrf, hlfVrf}. That is, Vin1XR=VinR, Vin2XR=VinR, ..., and DA4XR=hlfVrf.

At the end of the initial sampling phase, both switches S0 open, the Pvin signal is deasserted (e.g., a logic '0'), and the Pda signal is asserted (e.g., a logic '1'). An initial charge Q0 corresponding to Vin will be stored at node M, where Q0=(hlfVrf−Vin)·16C. Similarly, an initial charge Q0R corresponding to VinR will be stored at node P, where Q0=(hlfVrf−VinR)·16C.

The bit cycling phase begins when the Pvin signal is deasserted and the Pda signal is asserted. At the beginning of the bit cycling phase, the terminals of all capacitors of the first capacitor array 44A and the second capacitor array 44B connected to output terminals of the MUX42 and MUX31 components remain at the hlfVrf voltage level. When both switches S0 open, the voltages Vsum at node M, and VsumR at node P, acquire new values. More particularly, the voltages Vsum at node M and VsumR at node P acquire new values at a time after the opening of both switches S0 when the Pda signal is asserted (i.e., at the beginning of the bit cycling phase). It is noted that when Pvin is asserted, the outputs of the MUX42 components will be at Vin/VinR, and change to hlfVrf when Pda is asserted.

The voltage Vsum at the node M depends on Vin, and is ideally determined by the equation: Vsum=hlfVrf+Q0·Ct, where Ct=8C+8C+8C+4C+1C+1C=30C. Similarly, the voltage VsumR at the node P depends on VinR, and is ideally determined by the equation: VsumR=hlfVrf+Q0R·Ct. Once the Vsum and VsumR voltages stabilize, the output signal CmpOut produced by the comparator 42 will be latched by the SAR block 54. The SAR block 54 stores the received signal CmpOut as the most significant bit b[9] of the output signal b[9:0], and also produces the received signal CmpOut as the SIGN control signal as described above. The determination of the most significant bit b[9] takes one cycle of the CLOCK signal.

After the determination of the most significant bit b[9], the bits of the following bit groups may, for example, be determined: [b8:b6], [b5:b2], [b1], and [b0]. The value of the SIGN signal (i.e., the value of the most significant bit b[9]) is used to determine the values of the bits of the first bit group [b8:b6]. If the SIGN signal is asserted (e.g., a logic '1'), the SAR block 54 produces control signals which cause the decoder and MUXs component 52 to select one of 7 voltage reference pairs, Vc[m] and VcR[m] where 0≦m≦7, provide one voltage reference signal of one of the voltage reference pairs as the DA1 signal, and provide the other voltage reference signal of the voltage reference pair as DA1R signal. The pair of the MUX31 components receiving the DA1 and DA1R signals provides the DA1X and DA1XR signals to corresponding capacitors of the capacitor arrays 44A and 44B dependent upon the SIGN signal.

Via the binary search algorithm, and based on the state of CmpOut latched at proper times, proper voltages will be determined for DA1X and DA1XR signals after 3 cycles of the CLOCK signal. In the embodiment of FIG. 3, when the proper voltages are determined for the DA1X and DA1XR signals, the CmpOut signal produced by the comparator 42 transitions from a high voltage level to a low voltage level as the DA1X signal changes from voltage reference Vc[p] to voltage reference Vc[q], where q>p. Determination of the bits of the bit group [b8:b6] requires 3 cycles of the CLOCK signal.

The above binary search flow for determining the proper voltages for the DA1X and DA1XR signals is repeated for determining proper voltages for the DA2X and DA2XR signals, the DA3X and DA3XR signals, and the DA4X and DA4XR signals. It is noted that while determining proper voltages for DAmX and DAMXR signals (1≦m<4), the DAnX and DAnXR signals ((m+1)≦n≦4) are kept at hlfVrf. After another 6 cycles of the CLOCK signal, the bits of the remaining bit groups [b5:b2], [b1], and [b0] are determined.

During the bit cycling phase, the voltage Vsum at the node M is ideally given by the equation: Vsum=[Q0+ (hlfVrf·16C+DA1X·8C+DA2X·4C+DA3X·C+DA4X·C)]/

Ct, where Ct=8C+8C+8C+4C+1C+1C=30C. Similarly, the voltage VsumR at the node P is ideally given by the equation: VsumR=[Q0R+(hlfVrf·16CR+DA1XR·8C+ DA2XR·4C+DA3XR·C+DA4XR·C)]/Ct.

As described above, when the FD control signal is a logic '1', the R-C hybrid SAR ADC 30 operates in the fully-differential mode. Operation of the R-C hybrid SAR ADC 30 in the fully-differential mode is similar to operation in the pseudo-differential mode described above, except that when FD=1, the OUT1 terminals of the MUX42 components provide hlfVrf to the terminals of the corresponding capacitors of the capacitor arrays 44A and 44B for both the sampling and bit cycling phases. The OUT2 terminals of the MUX42 components provide Vin/VinR to the terminals of the corresponding capacitors of the capacitor arrays 44A and 44B during the sampling phase, and provide hlfVrf to the terminals of the corresponding capacitors of the capacitor arrays 44A and 44B during the bit cycling phase.

FIG. 5A is a diagram of one embodiment of a representative one of the MUX42 components of FIG. 3, and FIG. 5B is a diagram of one embodiment of a representative one of the MUX31 components of FIG. 3.

As described above, the R-C hybrid SAR ADC 30 of FIG. 3 includes several differential structures (e.g., the center-symmetric differential resistor string 50 and the dual capacitor arrays 44A and 44B) that allow the R-C hybrid SAR ADC 30 to provide a higher level of common-mode noise cancellation (i.e., common-mode noise immunity) than otherwise attainable. Analog input voltages are selectively handled in a pseudo differential or fully differential manner, and in either situation better performance is achieved than in the known single-ended input R-C hybrid SAR ADC 10 of FIG. 1. Common-mode noise signals, including direct current (DC) level shifts, cross talk, switching noise, power supply and ground voltage level variations, are cancelled in a first order.

Also, in the known R-C hybrid SAR ADC 10 of FIG. 1, parasitic resistances are commonly formed between the chip-internal reference ground, i.e., Vc[0], of the resistor string 50 (FIG. 2) and the external ground at the wire bond pad (e.g., due to vias, contacts, etc.). These parasitic resistances induce direct current (DC) level shifts such that the generated reference voltages include these DC level shifts. This problem may be made worse when the reference voltages with the DC level shifts are applied to the capacitors of the capacitor array 14, wherein the capacitors have different values. In this situation, the Vsum voltage on the node N will be a result of the different DC level shifts through each of the capacitors. On the other hand, the center-symmetric differential resistor string 50 and the dual capacitor arrays 44A and 44B of the R-C hybrid SAR ADC 30 of FIG. 3 tend to cancel any such effects by virtue of the dual circuitry driving the dual nodes M and P.

It is noted that although the RC-Hybrid SAR ADC 30 of FIG. 3 produces a 10-bit output signal b[9:0], the RC-Hybrid SAR ADC 30 may be easily modified to produce other numbers of output bits.

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. An analog-to-digital converter, comprising a resistor network for generating a plurality of reference voltages, the resistor network comprising a plurality of resistors connected in series to form a resistor string having a central node and two end nodes, resistors of a first string of the resistors having substantially equal resistances and being arranged between either one of the two end nodes and the central node, resistors of a second string of the resistors being arranged further from the central node than the resistors of the first string, resistors of the first string being refinements of a part of the resistors of the second string and the electrical resistances of the resistors of the second string being greater than the electrical resistances of the resistors of the first string, wherein equal numbers of the resistors are connected between the central node and each of the two end nodes, and wherein when an electrical potential is applied between the two end nodes the plurality of reference voltages are produced between adjacent resistors of the resistor string.

2. The analog-to-digital converter as recited in claim 1, wherein when the electrical potential is applied between the two end nodes, a reference voltage substantially equal to half the electrical potential is produced at the central node.

3. The analog-to-digital converter as recited in claim 1, wherein the electrical resistances of the resistors of the second string are 8 times the electrical resistances of the resistors of the first string.

* * * * *